(12) United States Patent
Li

(10) Patent No.: US 9,356,584 B2
(45) Date of Patent: May 31, 2016

(54) LEVEL SHIFTER

(71) Applicant: NOVATEK Microelectronics Corp., Hsin-Chu (TW)

(72) Inventor: Hsiang-Chi Li, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/554,047

(22) Filed: Nov. 26, 2014

(65) Prior Publication Data

US 2016/0056802 A1    Feb. 25, 2016

(30) Foreign Application Priority Data

Aug. 19, 2014 (TW) .............................. 103128470 A

(51) Int. Cl.
*H01L 23/62* (2006.01)
*H03K 3/356* (2006.01)
*H03K 19/0185* (2006.01)

(52) U.S. Cl.
CPC .. *H03K 3/356104* (2013.01); *H03K 19/018521* (2013.01)

(58) Field of Classification Search
CPC ................................................ H03K 3/356104
USPC ......................................................... 257/355
See application file for complete search history.

(56) References Cited

U.S. PATENT DOCUMENTS

| 7,053,656 | B2 | 5/2006 | Seo |
| 7,245,152 | B2 | 7/2007 | Wich |
| 8,749,292 | B2 | 6/2014 | Priel |
| 2005/0285623 | A1 | 12/2005 | Jahan |
| 2009/0066396 | A1 | 3/2009 | Lin |

*Primary Examiner* — Anthony Ho
(74) *Attorney, Agent, or Firm* — Winston Hsu; Scott Margo

(57) ABSTRACT

A level shifter for high-speed level shifting includes a first P-channel transistor, comprising a gate coupled to a drain, and a source coupled to a system voltage; a second P-channel transistor, comprising a gate coupled to the gate of the first P-channel transistor, and a source coupled to the system voltage; a first N-channel transistor, comprising a drain coupled to the drain of the first P-channel transistor, and a source coupled to a ground level; and a second N-channel transistor, comprising a drain coupled to a drain of the second P-channel transistor, and a source coupled to the ground level; wherein the first N-channel transistor and the second N-channel transistor are low-threshold-voltage transistors or native transistors.

9 Claims, 4 Drawing Sheets

LEVEL SHIFTER

BACKGROUND OF THE INVENTION

1. Field of the Invention

The present invention relates to a level shifter, and more particularly, to a level shifter capable of utilizing low threshold voltage transistors or native transistors for receiving input voltages, to perform high-speed level shifting to pull high output voltage.

2. Description of the Prior Art

In general, a low voltage to high voltage level shifter is utilized for shifting a voltage level of a received signal from a low voltage level to a high voltage level, so as to shift a low voltage signal generated by a low voltage front-end element to a high voltage signal for operations of a high voltage back-end element.

For example, please refer to FIG. 1, which is a schematic diagram of a conventional level shifter 10. As shown in FIG. 1, the level shifter 10 comprises P-channel Metal oxide semiconductor Field-Effect Transistors (MOSFETs) MP1, MP2, N-channel MOSFET transistors MN1, MN2 and a buffer 100, wherein P-channel MOSFET transistors MP1, MP2 and N-channel MOSFET transistors MN1, MN2 are high voltage elements.

In short, gates of the N-channel MOSFET transistors MN1, MN2 receive input voltages IN+, IN− generated by a low voltage front-end element, respectively, and when the input voltage IN+ is high and the input voltage IN− is low, the N-channel MOSFET transistor MN1 is turned on to pull low a voltage of a gate of the P-channel MOSFET transistor MP2. Therefore, the P-channel MOSFET transistor MP2 is turned on to pull high an output voltage Vout by a system voltage VDD (i.e. the output voltage Vout is charged to a voltage level of the system voltage VDD), and inverters comprised by the buffer 100 buffer the output voltage Vout to output a high voltage signal to a high voltage back-end element. As a result, the level shifter 10 can output the high voltage signal close to the voltage level of the system voltage VDD when determining the input voltage IN+ of the low voltage signal is high.

However, with development of semiconductor processing, the input voltage IN+ of the low voltage signal level becomes lower (e.g. a high level is reduced from 1.2V to 0.9V), and threshold voltages of the N-channel MOSFET transistors MN1, MN2 are unchanged (about 0.8V), but the high voltage level of the system voltage VDD is unchanged (e.g. 3.3V). Since a difference between the high level of the input voltage IN+ and the threshold voltage of the N-channel MOSFET transistor MN1 is much small and cannot effectively pull low the gate voltage of the P-channel MOSFET transistor MP2 to pull high the output voltage Vout. Therefore, the level shifter 10 cannot be applied in high-speed level shifting, or even for performing level shifting from low voltage to high voltage. Thus, there is a need for improvement of the prior art.

SUMMARY OF THE INVENTION

It is therefore an objective of the present invention to provide a level shifter capable of utilizing low threshold voltage transistors or native transistors for receiving input voltages, to perform high-speed level shifting to pull high output voltage.

The present invention discloses a level shifter for high-speed level shifting. The level shifter comprises a first P-channel transistor, comprising a gate, a drain and a source, the gate coupled to the drain, the source coupled to a system voltage; a second P-channel transistor, comprising a gate, a drain and a source, the gate coupled to the gate of the first P-channel transistor, the source coupled to the system voltage; a first N-channel transistor, comprising a gate, a drain and a source, the drain coupled to the drain of the first P-channel transistor, the source coupled to a ground level; and a second N-channel transistor, comprising a gate, a drain and a source, the drain coupled to the drain of the second P-channel transistor, the source coupled to a ground level; wherein the first N-channel transistor and the second N-channel transistor are low threshold voltage transistor or native transistors.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
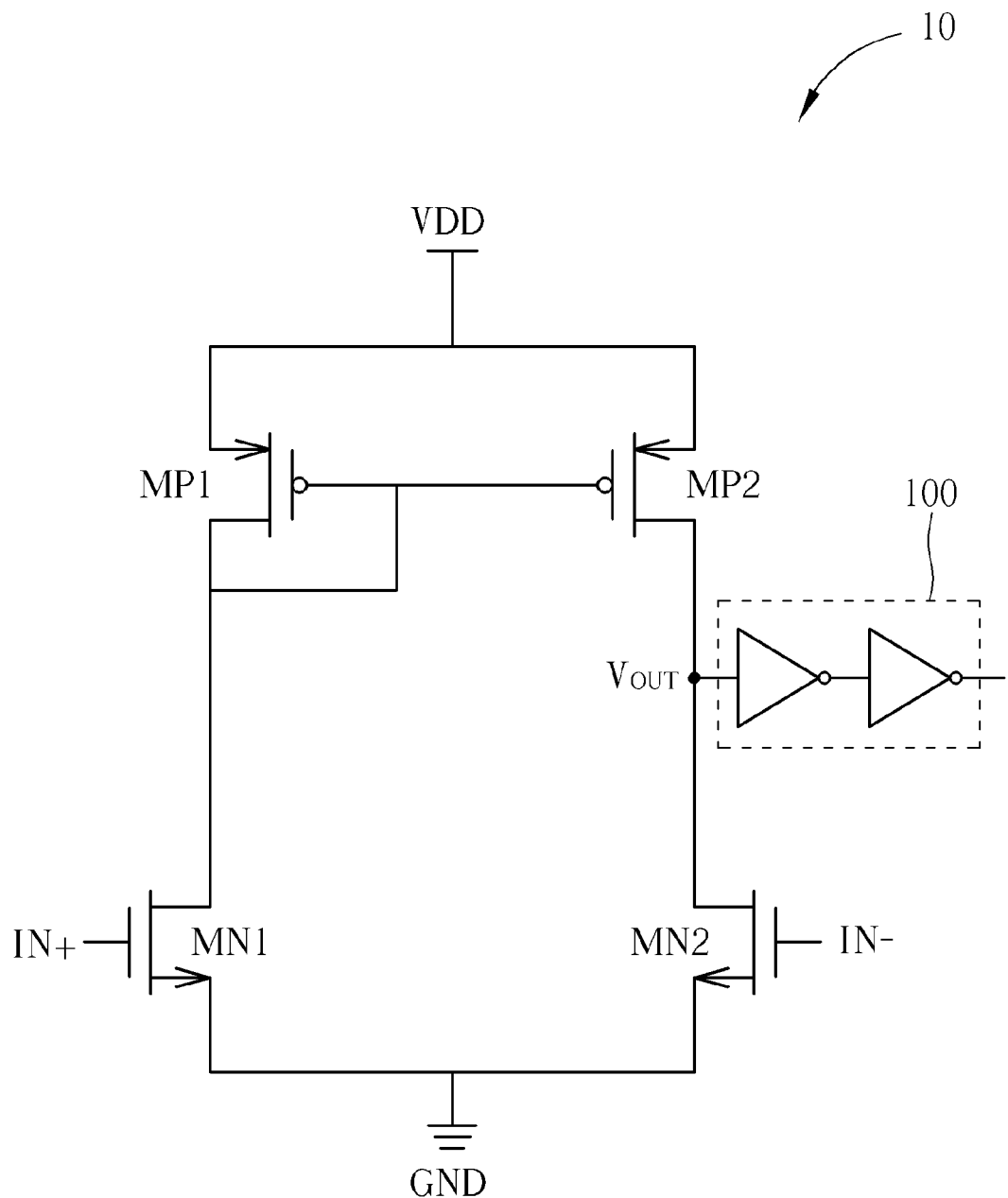
FIG. 1 is a schematic diagram of a conventional level shifter.
Figure 2:
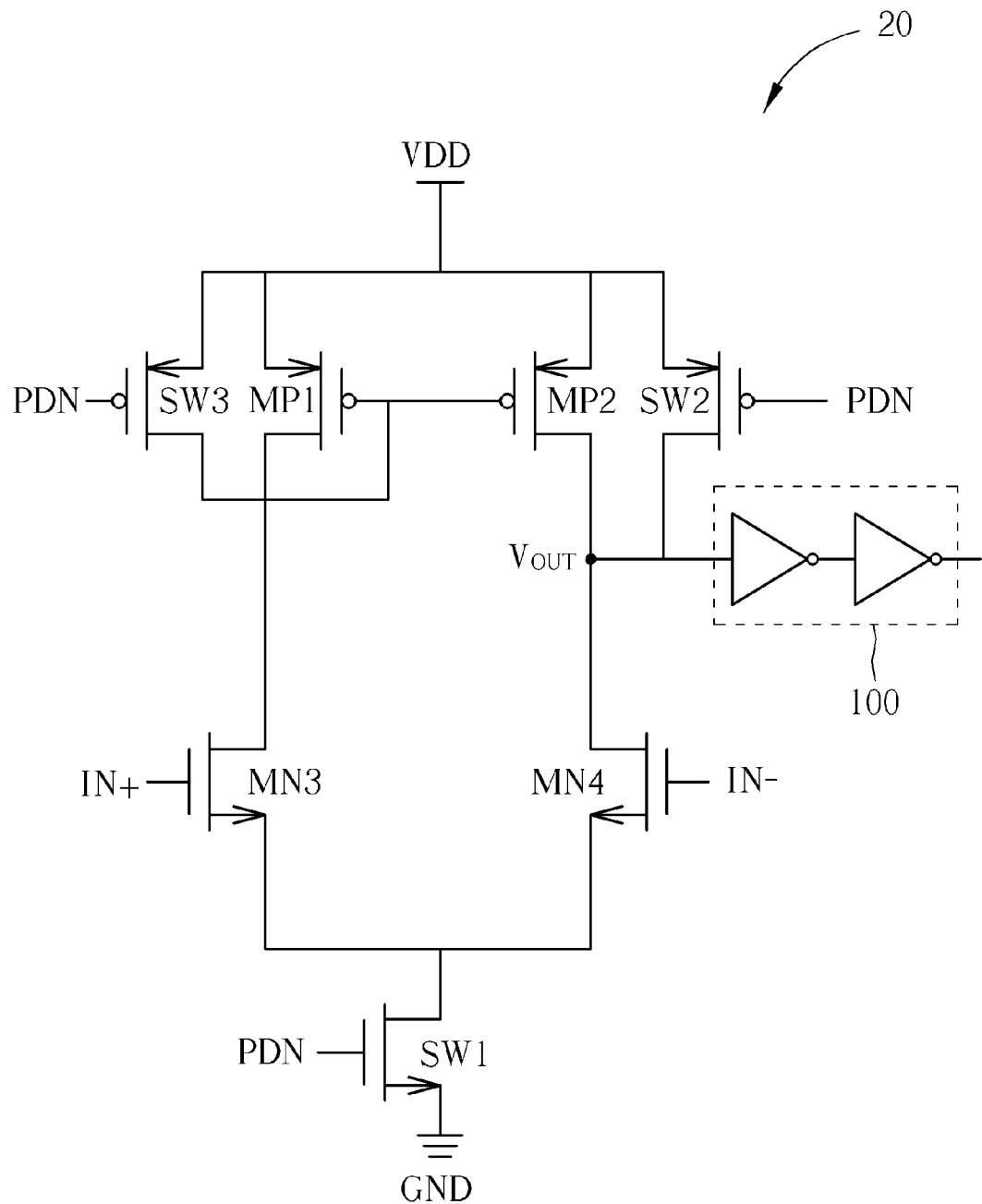
FIG. 2 is a schematic diagram of a level shifter according to an embodiment of the present invention.

Please refer to FIG. 2, which is a schematic diagram of a level shifter 20 according to an embodiment of the present invention. As shown in FIG. 2, parts of the level shifter 20 and the level shifter 10 are the same, and elements and signals with the same functions are denoted by the same symbol. In short, the level shifter 20 comprises P-channel Metal oxide semiconductor Field-Effect Transistors (MOSFETs) MP1, MP2, N-channel MOSFET transistors MN3, MN4 and the buffer 100. Detailed structure and connection configuration are as shown in FIG. 2. That is, a gate of the P-channel MOSFET transistor MP1 is coupled to a drain of the P-channel MOSFET transistor MP1, a source of the P-channel MOSFET transistor MP1 is coupled to a the system voltage VDD; a gate of the P-channel MOSFET transistor MP2 is coupled to the gate of the P-channel MOSFET transistor MP1, a source of the P-channel MOSFET transistor MP2 is coupled to the system voltage VDD; a drain of the N-channel MOSFET transistor MN3 is coupled to the drain of the P-channel MOSFET transistor MP1, a source of the N-channel MOSFET transistor MN3 is coupled to a ground level GND; a drain of the N-channel MOSFET transistor MN4 is coupled to a drain of the P-channel MOSFET transistor MP2, a source of the N-channel MOSFET transistor MN4 is coupled to the ground level GND; wherein the P-channel MOSFET transistors MP1, MP2 and the N-channel MOSFET transistors MN3, MN4 are high voltage elements. Main differences between the level shifter 20 and the level shifter 10 are that the N-channel MOSFET transistors MN3, MN4 are low threshold voltage transistors or native transistors.

Under such a configuration, since the N-channel MOSFET transistors MN3, MN4 are low threshold voltage transistors with threshold voltages substantially less than 0.3V or native transistors with threshold voltages substantially equal to 0V, when the input voltage IN+, IN− received by the gates of the N-channel MOSFET transistors MN3, MN4 from the low voltage front-end element are high level and low level, respectively, the N-channel MOSFET transistor MN3 can be effectively turned on (i.e. the high level is 0.9V which is much greater than the low threshold voltages less than 0.3V or the threshold voltages equal to 0V), so as to effectively pull low the gate voltage of the P-channel MOSFET transistor MP2. Therefore, the P-channel MOSFET transistor MP2 can be quickly turned on by the system voltage VDD to pull high rises the output voltage Vout (i.e. the output voltage Vout is charged to a voltage level of the system voltage VDD), and inverters comprised by the buffer 100 buffer the output voltage Vout to output a high voltage signal to a high voltage back-end element. As a result, the level shifter 20 can utilize low threshold voltage transistors or native transistors to realize the N-channel MOSFET transistors MN3, MN4 to receive the input voltage IN+, IN−, to widen the difference between the input voltage IN+ and the threshold voltage of the N-channel MOSFET transistor MN3, so as perform high-speed level shifting to pull high the output voltage Vout.

Besides, under the structure of realizing the N-channel MOSFET transistors MN3, MN4 with low threshold voltage transistors or native transistors, when the input voltage IN+ is not at a high level, the N-channel MOSFET transistor MN3 may be turned on or partially turned on to generate leakage current. Therefore, the level shifter 20 further comprises a switch SW1, coupled between the ground level GND and the sources of the N-channel MOSFET transistors MN3, MN4 of, for being turned off when the level shifter 20 does not operate (e.g. when the switch SW1 is realized by an N-channel MOSFET transistor, a control signal PDN received by a gate of N-channel MOSFET transistor can be at a low level to turn off the switch SW1 when the level shifter 20 does not operate and the input voltage IN+, IN− are pulled low to 0 voltage level by front-end circuits). As a result, the level shifter 20 can utilize the switch SW1 for control to avoid causing leakage currents when the N-channel MOSFET transistors MN3, MN4 are realized by low threshold voltage transistors or native transistors.

Moreover, when the switch SW1 is turned off to avoiding leakage currents, the drains of the P-channel MOSFET transistors MP1, MP2 (i.e. the drains of the N-channel MOSFET transistors MN3, MN4) are in a state of floating and may cause leakage currents (e.g. when the drain of the P-channel MOSFET transistor MP2 is affected by noise and thus the output voltage Vout is between a high level and a low level, an N-channel MOSFET transistor and a P-channel MOSFET transistor of the inverters comprised by the buffer 100 are simultaneously partially turned on to causes leakage currents). Therefore, the level shifter 20 further comprises switches SW2, SW3. The switch SW2 is coupled between the drain of the P-channel MOSFET transistor MP2 and the system voltage VDD, and is turned on to pull high the drain of the P-channel MOSFET transistor MP2 to the system voltage VDD when the level shifter 20 does not operate (e.g. when the switch SW2 is realized by a P-channel MOSFET transistor, the control signal PDN received by a gate of the P-channel MOSFET transistor can be a low level to turn on the switch SW2 when the level shifter 20 does not operate and the input voltage IN+, IN− are pulled low to 0 voltage level by front-end circuits). The switch SW3 is coupled between the drain of the P-channel MOSFET transistor MP1 and the system voltage VDD, and is turned on to pull high the drain of the P-channel MOSFET transistor MP1 to the system voltage VDD when the level shifter 20 does not operate (e.g. when the switch SW3 is realized by a P-channel MOSFET transistor, the control signal PDN received by a gate of the P-channel MOSFET transistor can be a low level to turn on the switch SW3 when the level shifter 20 does not operate and the input voltage IN+, IN− are pulled low to 0 voltage level by front-end circuits). As a result, the level shifter 20 can utilize the switches SW2, SW3 for control to prevent the drains of the P-channel MOSFET transistors MP1, MP2 from being in a state of floating and causing leakage currents.

Noticeably, the spirit of the above embodiment is to realize the N-channel MOSFET transistors MN3, MN4 with low threshold voltage transistors or native transistors to receive the input voltage IN+, to widen the difference between the input voltage IN+ and the threshold voltage of the N-channel MOSFET transistor MN3, so as perform high-speed level shifting to pull high the output voltage Vout. Those skilled in the art can make modifications or alterations accordingly. For example, in the above embodiments, the P-channel MOSFET transistors MP1, MP2 and the N-channel MOSFET transistors MN3, MN4 are both realized by MOSFET transistors, but can be realized by other types of transistors in other embodiments. Besides, in the above embodiment, the switches SW1-SW3 are realized by an N-channel MOSFET transistor and two P-channel MOSFET transistors, respectively, but can be realized by other types of switches in other embodiments. Moreover, in the above embodiment, the switch SW1 can avoid causing leakage currents by realizing the N-channel MOSFET transistors MN3, MN4 with low threshold voltage transistors or native transistors, and the switch SW2, SW3 can prevent the drains of the P-channel MOSFET transistors MP1, MP2 from being in a state of floating and causing leakage currents, but in other embodiments, if leakage currents are small or a state of floating is not a concern, the level shifter 20 may not comprise the switch SW3 (i.e. the drain of the P-channel MOSFET transistor MP1 is in a state of floating), may not comprise the switches SW2, SW3 (i.e. the drains of the P-channel MOSFET transistors MP1, MP2 are in a state of floating and the inverters comprised by the buffer 100 may generate leakage currents) or may not comprise the switches SW1-SW3 (i.e. the N-channel MOSFET transistors MN3, MN4 realized by low threshold voltage transistors or native transistors may cause leakage currents).

Figure 3:
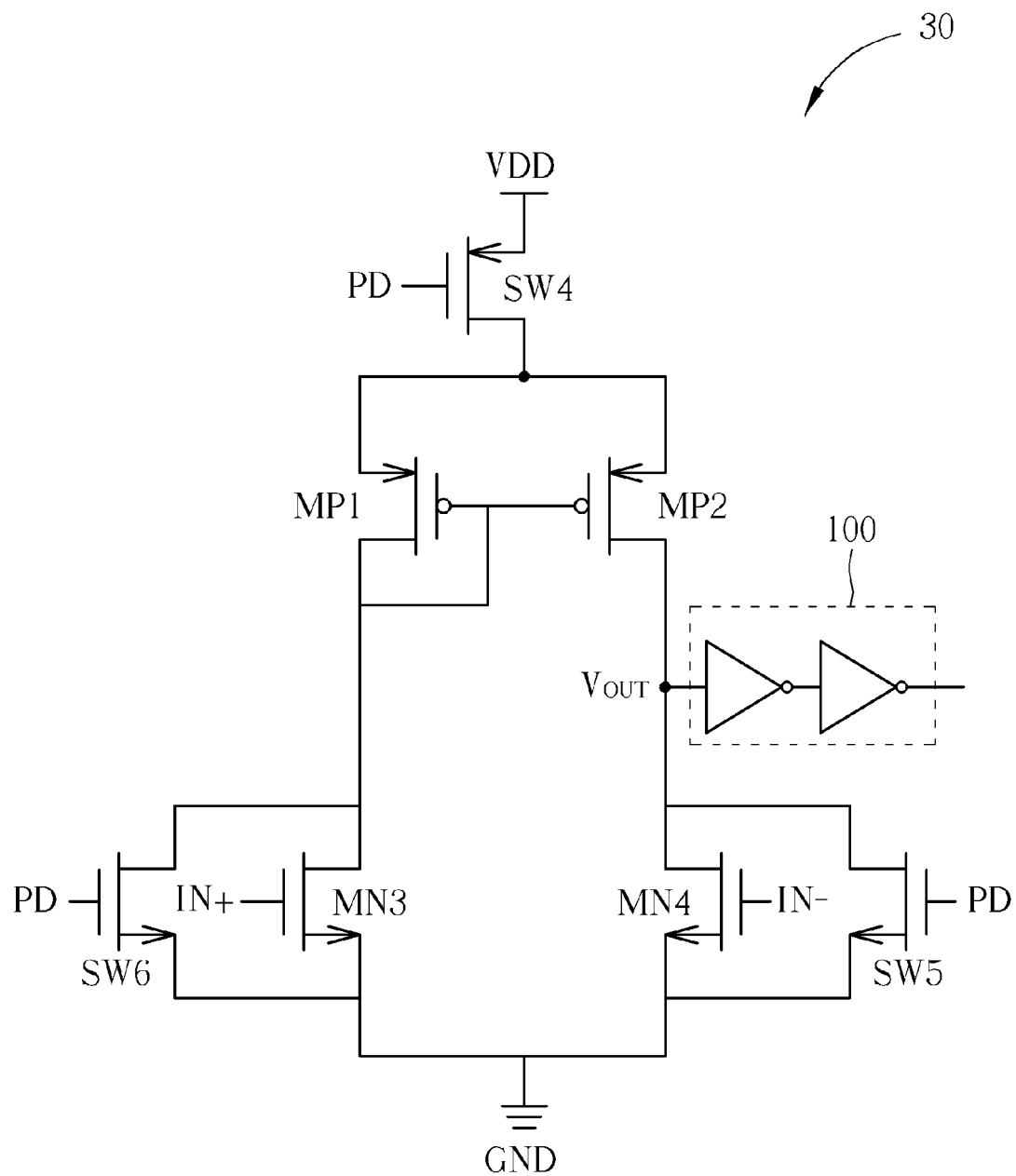
FIG. 3 is a schematic diagram of another level shifter according to an embodiment of the present invention.

In addition, in the above embodiment, the switches SW1-SW3 are configured in positions shown in FIG. 2 to achieve respective functions, but switches can be configured in other positions to achieve respective functions of the switches SW1-SW3 in other embodiments. For example, please refer to FIG. 3, which is a schematic diagram of another level shifter 30 according to an embodiment of the present invention. As shown in FIG. 3, parts of the level shifter 30 and the level shifter 20 are the same, and elements and signals with the same functions are denoted by the same symbol. Main differences between the level shifter 30 and the level shifter 20 are that the level shifter 30 comprises a switch SW4, coupled between the system voltage VDD and the sources of the P-channel MOSFET transistors MP1, MP2, for being turned off when the level shifter 30 does not operate (e.g. when the switch SW4 is realized by an P-channel MOSFET transistor, a control signal PD received by a gate of N-channel MOSFET transistor can be at a high level to turn off the switch SW4 when the level shifter 30 does not operate and the input voltage IN+, IN− are pulled low to 0 voltage level by front-end circuits). As a result, the level shifter 30 can utilize the switch SW4 for control to avoid causing leakage currents when the N-channel MOSFET transistors MN3, MN4 are realized by low threshold voltage transistors or native transistors.

Besides, the level shifter 30 comprises switches SW5, SW6. The switch SW5 is coupled between the drain of the N-channel MOSFET transistor MN4 and the ground level GND, and is turned on to pull low the drain of the N-channel MOSFET transistor MN4 to the ground level GND when the level shifter 30 does not operate (e.g. when the switch SW5 is realized by a N-channel MOSFET transistor, the control signal PD received by a gate of the N-channel MOSFET transistor can be a high level to turn on the switch SW5 when the level shifter 30 does not operate and the input voltage IN+, IN− are pulled low to 0 voltage level by front-end circuits). The switch SW6 is coupled between the drain of the N-channel MOSFET transistor MN3 and the ground level GND, and is turned on to pull low the drain of the N-channel MOSFET transistor MN3 to the ground level GND when the level shifter 30 does not operate (e.g. when the switch SW6 is realized by a N-channel MOSFET transistor, the control signal PD received by a gate of the N-channel MOSFET transistor can be a high level to turn on the switch SW6 when the level shifter 30 does not operate and the input voltage IN+, IN− are pulled low to 0 voltage level by front-end circuits). As a result, the level shifter 30 can utilize the switches SW5, SW6 for control to prevent the drains of the P-channel MOSFET transistors MP1, MP2 from being in a state of floating and causing leakage currents.

Figure 4:
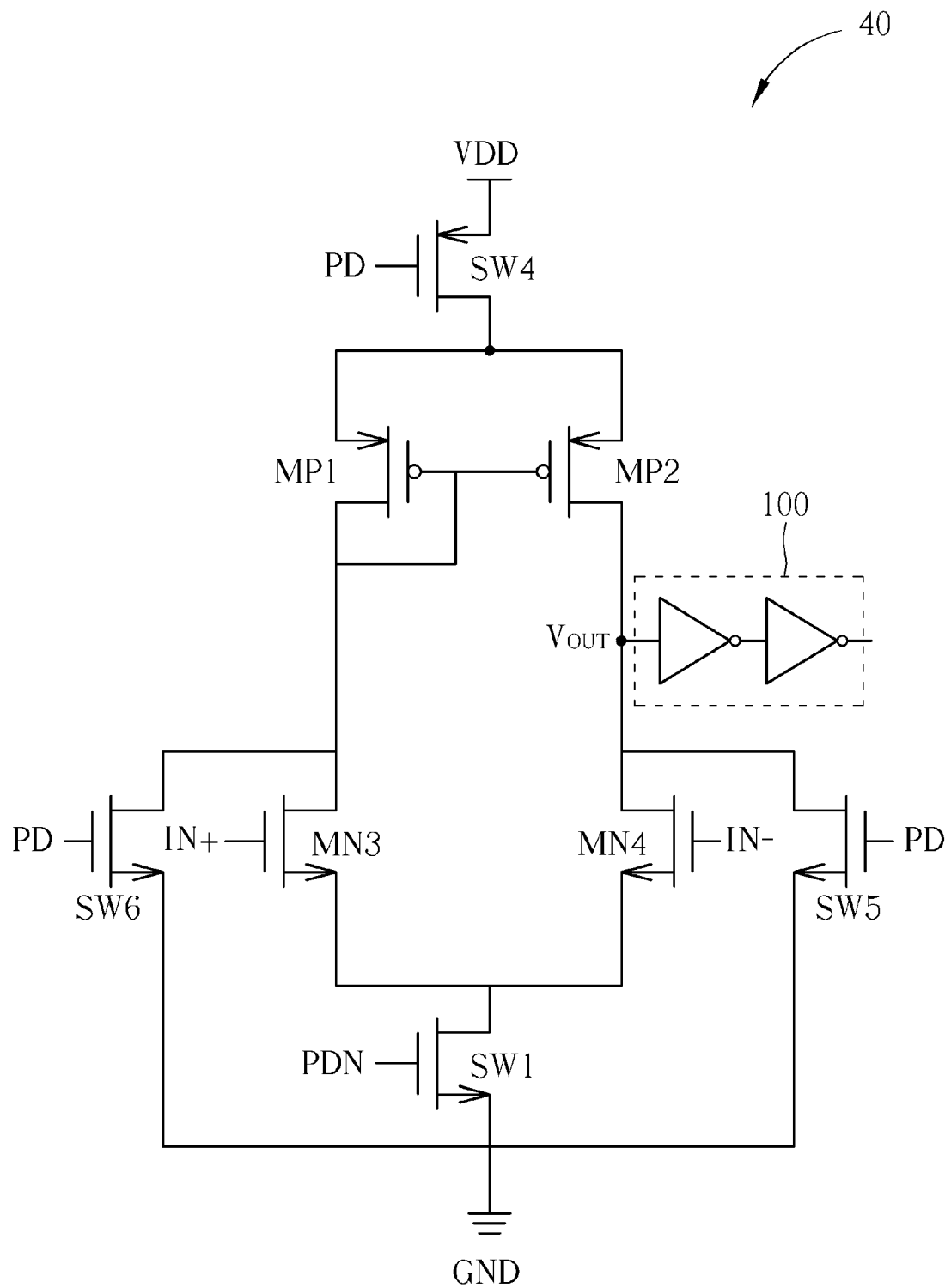
FIG. 4 is a schematic diagram of another level shifter according to an embodiment of the present invention.

In addition, the switches SW1-SW3 of the level shifter 20 and the switches SW4-SW6 of the level shifter 30 can be implemented together in other forms to achieve respective functions. For example, please refer to FIG. 4, which is a schematic diagram of another level shifter 40 according to an embodiment of the present invention. As shown in FIG. 4, parts of the level shifter 40 and the level shifters 20, 30 are the same, and elements and signals with the same functions are denoted by the same symbol. Main differences between the level shifter 40 and the level shifters 20, 30 are that in addition to the switches SW4-SW6 of the level shifter 30, the level shifter 40 further comprises the switch SW1 of the level shifter 20 to further avoid causing leakage currents when the N-channel MOSFET transistors MN3, MN4 are realized by low threshold voltage transistors or native transistors. Operations of the switches SW1, SW4-SW6 can be derived by referring to the above description, and are not narrated hereinafter.

In the prior art, a difference between the high level of the input voltage IN+ and the threshold voltage of the N-channel MOSFET transistor MN1 is much small and cannot effectively pull low the gate voltage of the P-channel MOSFET transistor MP2 to pull high the output voltage Vout. Therefore, the level shifter 10 cannot be applied in high-speed level shifting, or even for performing level shifting from low voltage to high voltage.

In comparison, the above embodiment realizes the N-channel MOSFET transistors MN3, MN4 with low threshold voltage transistors or native transistors to receive the input voltage IN+, to widen the difference between the input voltage IN+ and the threshold voltage of the N-channel MOSFET transistor MN3, so as perform high-speed level shifting to pull high the output voltage Vout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter, for high-speed level shifting, comprising:
    a first P-channel transistor, comprising a gate, a drain and a source, the gate coupled to the drain, the source coupled to a system voltage;
    a second P-channel transistor, comprising a gate, a drain and a source, the gate coupled to the gate of the first P-channel transistor, the source coupled to the system voltage;
    a first N-channel transistor, comprising a gate, a drain and a source, the drain directly connected to the drain of the first P-channel transistor, the source coupled to a ground level;
    a second N-channel transistor, comprising a gate, a drain and a source, the drain directly connected to the drain of the second P-channel transistor, the source coupled to a ground level; and
    a first switch, coupled between the ground level and the sources of the first N-channel transistor and the second N-channel transistor;
    wherein the first N-channel transistor and the second N-channel transistor are low threshold voltage transistor or native transistors.

2. The level shifter of claim 1, wherein the first P-channel transistor, the second P-channel transistor, the first N-channel transistor and the second N-channel transistor are Metal oxide semiconductor Field-Effect Transistors (MOSFETs).

3. The level shifter of claim 1, wherein first N-channel transistor and second N-channel transistor are low threshold voltage transistors with threshold voltages substantially less than 0.3 volt or native transistors with threshold voltages substantially equal to 0 volt.

4. The level shifter of claim 1, wherein the first switch is configured for being turned off when the level shifter does not operate.

5. The level shifter of claim 4 further comprising a second switch, coupled between the drain of the second P-channel transistor and the system voltage, for being turned on when the level shifter does not operate.

6. The level shifter of claim 5 further comprising a third switch, coupled between the drain of the first P-channel transistor and the system voltage, for being turned on when the level shifter does not operate.

7. The level shifter of claim 1 further comprising a fourth switch, coupled between the system voltage and the sources of the first P-channel transistor and the second P-channel transistor, for being turned off when the level shifter does not operate.

8. The level shifter of claim 7 further comprising a fifth switch, coupled between the drain of the second N-channel transistor and the ground level, for being turned on when the level shifter does not operate.

9. The level shifter of claim 8 further comprising a sixth switch, coupled between the drain of the first N-channel transistor and the ground level, for being turned on when the level shifter does not operate.

* * * * *